United States Patent
Park et al.

(10) Patent No.: US 6,682,978 B1
(45) Date of Patent: Jan. 27, 2004

(54) INTEGRATED CIRCUIT HAVING INCREASED GATE COUPLING CAPACITANCE

(75) Inventors: Stephen Keetai Park, Cupertino, CA (US); Steven C. Avanzino, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/504,087

(22) Filed: Feb. 15, 2000

Related U.S. Application Data
(60) Provisional application No. 60/151,458, filed on Aug. 30, 1999.

(51) Int. Cl.⁷ .............................................. H01L 21/336
(52) U.S. Cl. ...................................... 438/259; 438/424
(58) Field of Search ................................. 438/201, 211, 438/224, 230, 259, 264, 296, 424, 593, 595, 655, 787, 791

(56) References Cited

U.S. PATENT DOCUMENTS

| | | | |
|---|---|---|---|
| 5,053,839 A | 10/1991 | Esquivel et al. | 357/23.5 |
| 5,338,953 A | 8/1994 | Wake | 267/316 |
| 5,589,412 A | 12/1996 | Iranmanesh et al. | 437/43 |
| 5,753,525 A * | 5/1998 | Hsu et al. | 437/43 |
| 5,753,951 A | 5/1998 | Geissler | 257/316 |
| 5,859,459 A | 1/1999 | Ikeda | 257/374 |
| 5,885,883 A | 3/1999 | Park et al. | 438/435 |
| 5,914,523 A * | 6/1999 | Bashir et al. | 257/520 |
| 6,146,970 A * | 11/2000 | Witek et al. | 438/424 |
| 6,171,962 B1 * | 1/2001 | Karlsson et al. | 438/692 |
| 6,258,669 B1 | 7/2001 | Park | 438/264 |
| 6,281,555 B1 * | 8/2001 | Yu et al. | 257/374 |
| 6,323,102 B1 * | 11/2001 | Horita et al. | 438/424 |

FOREIGN PATENT DOCUMENTS

| | | | | |
|---|---|---|---|---|
| EP | 0351316 | | 1/1990 | |
| EP | 0841693 A1 | | 5/1998 | |
| EP | 0841693 | * | 5/1998 | |
| EP | 841693 | * | 5/1998 | ....... H01L/21/8247 |
| JP | 04208572 | | 7/1992 | |
| JP | 8-88285 | | 4/1996 | |
| JP | 08097306 | | 12/1996 | |
| JP | 09213783 | | 8/1997 | |
| WO | WO 96/08840 | | 3/1996 | |
| WO | WO 99/31730 | | 6/1999 | |

* cited by examiner

*Primary Examiner*—Amir Zarabian
*Assistant Examiner*—Pamela E Perkins
(74) *Attorney, Agent, or Firm*—Foley & Lardner

(57) ABSTRACT

The present invention is directed to an integrated circuit having an increased gate coupling capacitance. The integrated circuit includes a substrate having a surface, the substrate having a trench extending below the surface. A trench fill material is disposed in the trench and has a portion extending above the surface. A first conductive layer is adjacent the trench fill material and has a portion extending over the portion of the insulative material. An insulative layer is adjacent the first conductive layer and a second conductive layer is adjacent the insulative layer. The present invention further is directed to a method of fabricating an integrated circuit on a substrate including the steps of forming a trench in the substrate, the trench extending below a surface of the substrate; providing a trench fill material in the trench such that the trench fill material extends above the surface of the substrate; and providing a first conductive layer over at least a portion of the trench fill material.

20 Claims, 8 Drawing Sheets

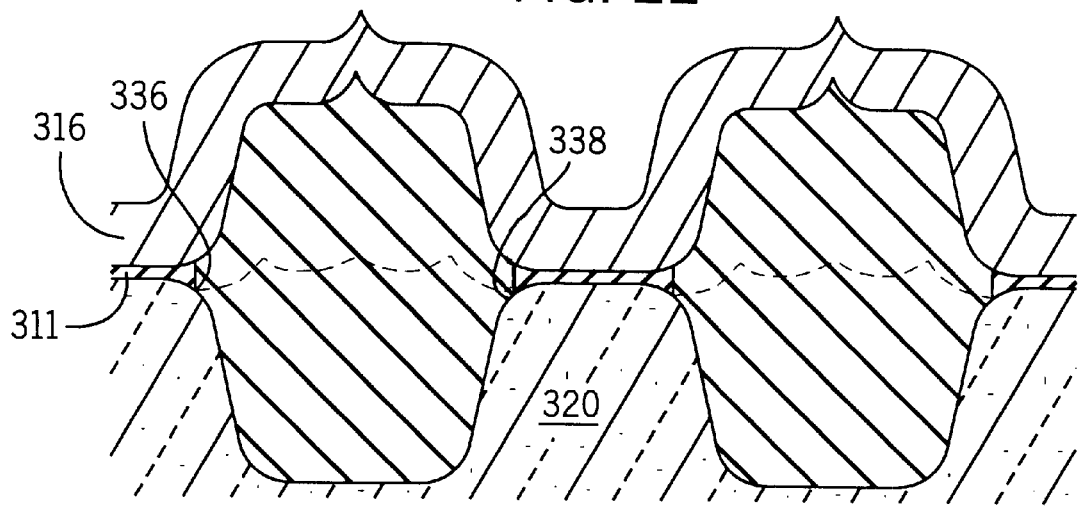
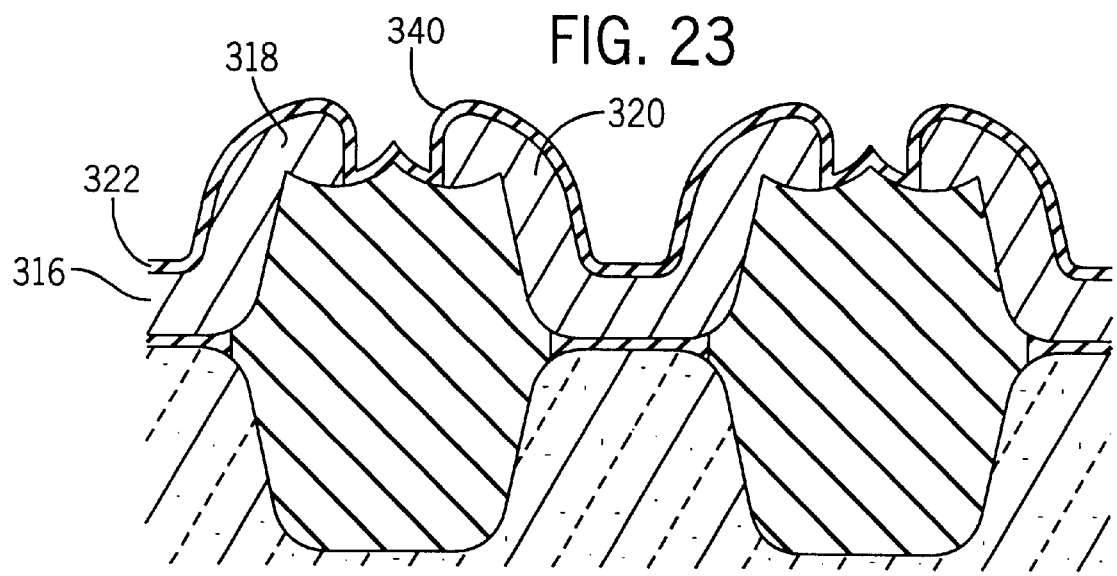

INTEGRATED CIRCUIT HAVING INCREASED GATE COUPLING CAPACITANCE

CROSS-REFERENCE TO RELATED APPLICATIONS

The present application claims the benefit of priority under Title 35, United States Code §119(e) of U.S. Provisional Application No. 60/151,458 filed Aug. 30, 1999. The present application is related to the following commonly assigned applications: "Integrated Circuit Having Optimized Gate Coupling Capacitance", Application Ser. No. 09/387,710 filed Aug. 30, 1999; "Integrated Circuit Having Improved Gate Coupling Capacitance", Application Ser. No. 09/385,534 filed Aug. 30, 1999; and "Integrated Circuit Having Resistance To Silicide Crack", Application Ser. No. 09/385,164 filed Aug. 30, 1999.

FIELD OF THE INVENTION

The present invention relates generally to an integrated circuit having increased gate coupling capacitance. The present invention further relates to an integrated circuit having a conductive layer optimized for gate coupling capacitance.

BACKGROUND OF THE INVENTION

The present invention applies particularly to the fabrication of nonvolatile memory integrated circuits (e.g., flash, EPROM, EEPROM, etc.), but may find applications in other integrated circuits. Nonvolatile memory integrated circuits are used in a wide variety of commercial and military electronic devices, including hand held telephones, radios and digital cameras. The market for these electronic devices continues to demand lower voltage, lower power consumption and decreased chip size. Also, the demand for greater functionality is driving the design rule lower, from the 0.35–0.25 micron technology of today to 0.18 micron, 0.15 micron and lower.

A conventional flash memory cell of a flash memory IC is illustrated in FIGS. 1 and 2. FIG. 1 depicts a cross-sectional view along the bit line direction of a single flash memory cell 10 on a substrate 11. Cell 10 includes a first transistor 12 and a second transistor 14. Each of transistors 12, 14 includes a tunnel oxide layer 16, a first polysilicon layer 18, 20, an interpoly dielectric layer 22, 24, a second polysilicon layer 26, 28, a silicide layer 30, 32 and sidewall spacers 34, 36.

With reference first to FIGS. 2–7, a conventional flash memory cell fabrication process is illustrated. A substrate 11 is shown in FIGS. 2–7 in a cross-sectional view along the word line direction. Substrate 11 includes a shallow trench isolation structure (STI) 40 between devices (not shown), such as, metal-oxide-semiconductor field effect transistors (MOSFETs), memory cells, or other devices. STI 40 includes an oxide fill material 42. A tunnel oxide layer 16 is provided above substrate 11. First and second polysilicon wings 46, 48 are patterned in first polysilicon layer 20. Interpoly dielectric layer 24 is provided above polysilicon wings 46, 48 and also above STI 40. Second polysilicon layer 28 and silicide layer 32 are provided above interpoly dielectric layer 24.

Referring now to FIG. 3, STI 40 is formed by first applying a pad oxide layer 50 over substrate 11 and subsequently growing or depositing a nitride layer 52. A STI mask and etch step forms STI recess 54. Referring now to FIG. 4, an STI liner oxide 56 is provided to line recess 54 followed by a trench fill with a PECVD oxide fill material 58 (Plasma Enhanced Chemical Vapor Deposition). As shown in FIG. 5, a planarization step and a trench CMP (Chemical Mechanical Polishing) step are applied to PECVD oxide fill material 58 to remove the oxide above nitride layer 52 and partially along sides 60, 62 of nitride layer 52.

Referring now to FIG. 6, a nitride strip step removes nitride layer 52. Pad oxide layer 50 is removed by sacrificial oxidation. Subsequently, a tunnel oxide layer 64 is grown above substrate 11. Referring now to FIG. 7, a first polysilicon layer 20 is applied. Layer 20 is patterned (i.e., masked and etched) to form wings 46, 48. Referring again to FIG. 2, interpoly dielectric layer 24 (e.g., Oxide Nitride Oxide) is grown over wings 46, 48. Second polysilicon layer 28 is then deposited, followed by deposition of silicide layer 32.

In operation, a data element is stored on polysilicon layers 18, 20 (FIG. 1), also called the floating gate. Access to the data element is obtained via second polysilicon layers 26, 28, also called the control gate or wordline. While the voltage of the data element is typically on the order of 3.3 Volts, the voltage that must be applied to the control gate to access this data element is on the order of 9 Volts. Thus, a charge pump (not shown) is located on the flash memory IC to raise the chip voltage from 3.3 Volts to a target voltage of 9 Volts.

Charge pumps are large, taking up substantial space on the flash memory cell and further comprising the reliability of the IC. As design rules continue to decrease, the size of the charge pump becomes an obstacle in chip design. However, the size of the charge pump can be decreased by decreasing the target voltage. The target voltage can be decreased by increasing the gate coupling ratio (a) of the memory cell. Gate coupling ratio ($\alpha$) is defined as:

$$\alpha = C_{ono}/(C_{ono}+C_{tox})$$

where $C_{ono}$ is the capacitance between first polysilicon layer 18, 20 and second polysilicon layer 26, 28 and $C_{tox}$ is the capacitance between substrate 11 and first polysilicon layer 18, 20.

Accordingly, what is needed is an IC and method of fabricating an IC to increase the gate coupling ratio, decreasing the target voltage of the charge pump, thereby decreasing power consumption of the IC, decreasing the size of the charge pump, and improving reliability.

SUMMARY OF THE INVENTION

These and other limitations of the prior art are addressed by the present invention which is directed to an integrated circuit having an increased gate coupling capacitance. The integrated circuit includes a substrate having a surface, the substrate having a trench extending below the surface. A trench fill material is disposed in the trench and has a portion extending above the surface. A first conductive layer is adjacent the trench fill material and has a portion extending over the portion of the insulative material. An insulative layer is adjacent the first conductive layer and a second conductive layer is adjacent the insulative layer.

According to another embodiment of the present invention, a method of fabricating an integrated circuit on a substrate is provided. The method includes forming a trench in the substrate, the trench extending below a surface of the substrate, providing a trench fill material in the trench such that the trench fill material extends above the surface of the substrate, and providing a first conductive layer over at least a portion of the trench fill material.

According to yet another embodiment of the present invention, integrated circuit having an increased gate coupling capacitance is disclosed. The integrated circuit is fabricated by a process including forming a trench in the substrate, the trench extending below a surface of the substrate; providing a trench fill material in the trench such that the trench fill material extends above the surface of the substrate; and providing a first conductive layer over at least a portion of the trench fill material.

BRIEF DESCRIPTION OF THE DRAWINGS

The invention will become more fully understood from the following detailed description, taken in conjunction with the accompanying drawings, wherein like reference numerals refer to like parts, and in which:

FIG. 22 depicts steps in the process of fabrication of the portion of an integrated circuit of FIG. 18; and FIG. 23 depicts steps in the process of fabrication of the portion of an integrated circuit of FIG. 18.

DETAILED DESCRIPTION OF THE PREFERRED EMBODIMENTS

As stated hereinabove, an increase in the gate coupling ratio is required to decrease the target voltage of the charge pump to, in turn, decrease the size of the charge pump. The present invention achieves an increase in the gate coupling ratio by increasing the capacitance across the interpoly dielectric layer between first and second polysilicon layers (a.k.a., "poly 1" and "poly 2", respectively). As will be shown, this increase is obtained by increasing the surface area across which poly 1 and poly 2 are in contact, thereby increasing the surface area of the capacitor formed by poly 1, poly 2 and the interpoly dielectric layer.

Figure 8:
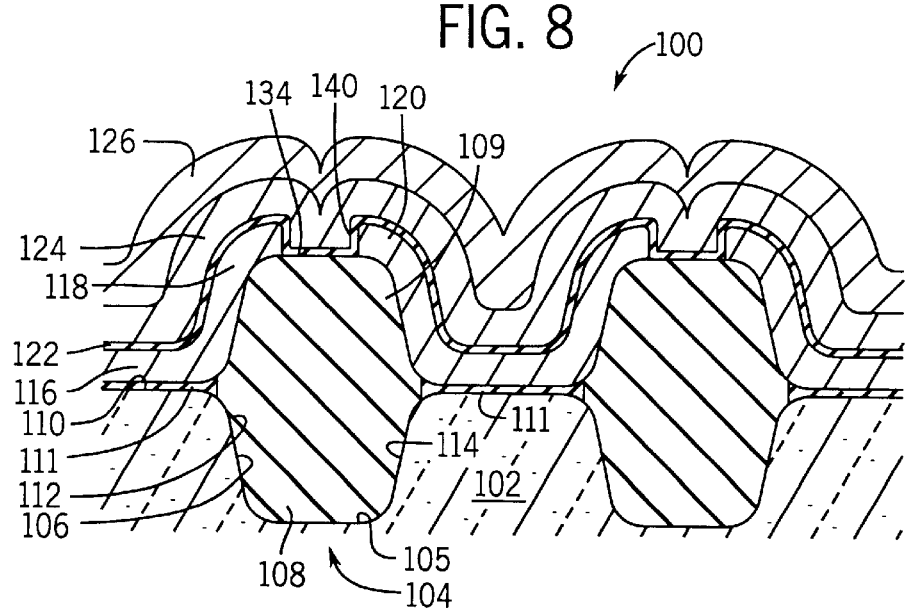
FIG. 8 depicts a portion of an integrated circuit according to an exemplary embodiment of the present invention.

With reference now to FIG. 8, a portion 100 of an integrated circuit (IC) having an improved gate coupling ratio according to one embodiment of the present invention is shown in cross-section along the word line direction. The IC is a flash memory device, but may alternatively be another nonvolatile memory (e.g., EPROM, EEPROM, etc.) or other integrated circuit. A semiconductor substrate 102 (e.g., silicon, germanium, gallium arsenide, etc.) includes an isolation structure 104 defined in a recess or trench 106. In this embodiment, isolation structure 104 is a shallow trench isolation structure containing a trench fill material 108. Trench fill material 108 is an insulative material, such as, PECVD oxide. Trench fill material 108 extends from the bottom of recess 106 toward an upper surface 110 of substrate 102 and includes a portion 109 extending above upper surface 110. Recess 106 has a bottom surface 105 approximately 1000 to 7000 Angstroms (Å) below upper surface 110 and preferably about 4000 Å below upper surface 110.

A first insulative layer 111, such as, a tunnel oxide layer, is provided over upper surface 110 of substrate 102 and over side walls 112, 114 of recess 106. A first conductive layer 116, such as, doped polysilicon is provided adjacent first insulative layer 111 and trench fill material 108. First conductive layer 116 is masked and etched to form a first conductive wing or portion 118 and a second conductive wing or portion 120. First conductive layer 116 also defines a via 140 between conductive portions 118, 120. First and second conductive portions 118, 120 extend at least partially over portion 109 of trench fill material to increase the surface area that conductive layer 116 has exposed to the subsequent layers, relative to the prior art. This increase in surface area results in an increase in capacitance, which raises the gate coupling ratio as described hereinbefore. In this exemplary embodiment, an upper surface 134 of trench fill material 108 is at least 100 Å above upper surface 110 of substrate 102. Upper surface 134 may be as high as 5000 Å above upper surface 110 of substrate 102, and may be approximately 1000 to 2000 Å above upper surface 110 of substrate 102.

A second insulative layer 122, such as, an interlevel dielectric layer (e.g., Oxide Nitride Oxide) is provided over first conductive layer 116 and trench fill material 108. Insulative layer 122 forms an insulative barrier between conductive portions 118, 120. A second conductive layer 124, such as, doped polysilicon is provided over second insulative layer 122. Thus, insulative layer 122 also insulates layers 116 and 124 from one another. A silicide layer 126 is provided over second conductive layer 124.

Figure 9:
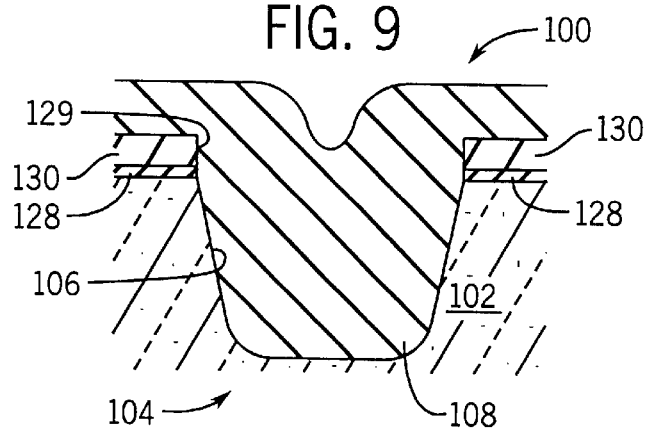
FIG. 9 depicts steps in the process of fabrication of the portion of an integrated circuit of FIG. 8.

Referring now to FIGS. 9–13, a method of fabricating portion 100 is described. In FIG. 9, isolation structure 104 is formed by providing an insulative layer 128 including an oxide material (e.g., a pad oxide material, such as, $SiO_2$)

over substrate 102. Layer 128 is grown in a conventional thermal process, or applied by a chemical vapor deposition (CVD) or a physical vapor deposition (PVD) process. Subsequently, a barrier layer 130, preferably a silicon nitride layer, e.g., $Si_3N_4$, is applied over insulative layer 128 with a thickness of approximately 500 to 5000 Å, preferably about 1000 to 2000 Å. Using a standard photolithographic process, an aperture 129 is formed in layers 128, 130 at the desired location. A conventional trench etching process, such as a dry or plasma etch, is then utilized to etch recess 106 in substrate 102. A liner oxidation step forms an insulative liner (not shown) along the walls of recess 106.

Figure 1:
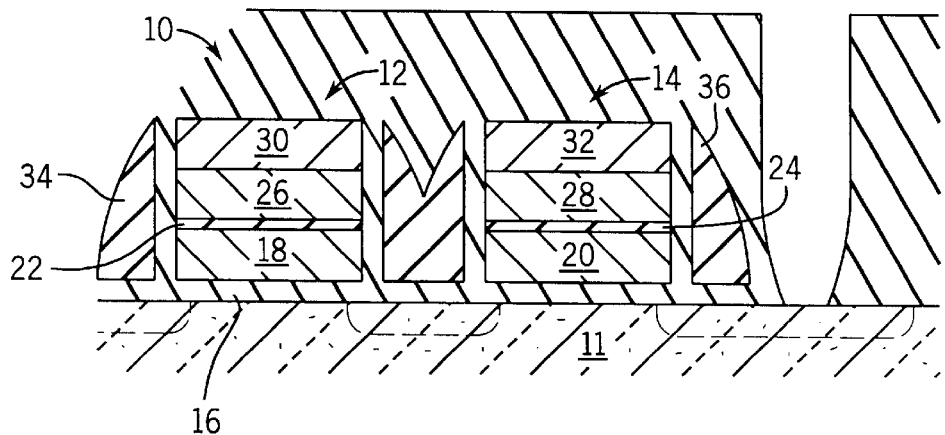
FIG. 1 depicts a cross-sectional view of a conventional flash memory cell along the bit line direction.
Figure 2:
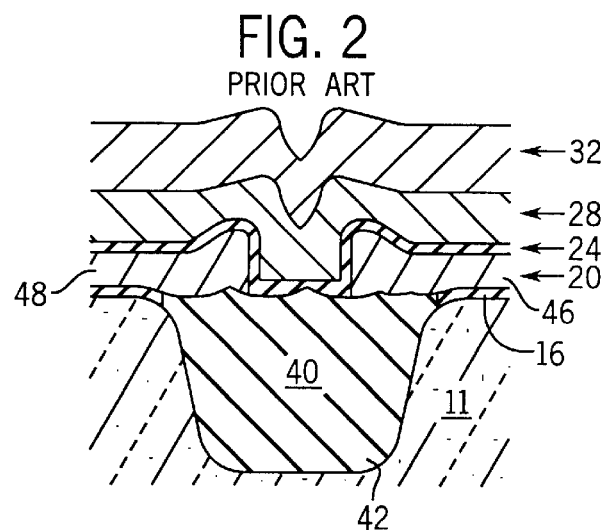
FIG. 2 depicts a cross-sectional view of the memory cell of FIG. 1 along the word line direction.
Figure 3:
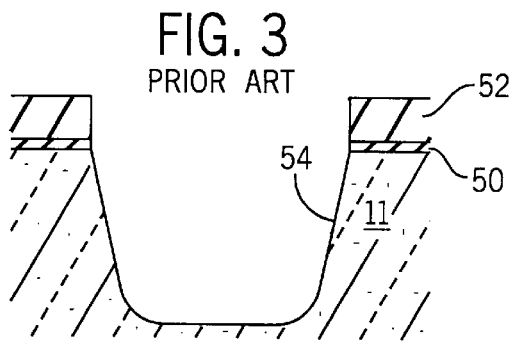
FIG. 3 depicts steps in the process of fabrication of the conventional flash memory cell of FIGS. 1 and 2.
Figure 4:
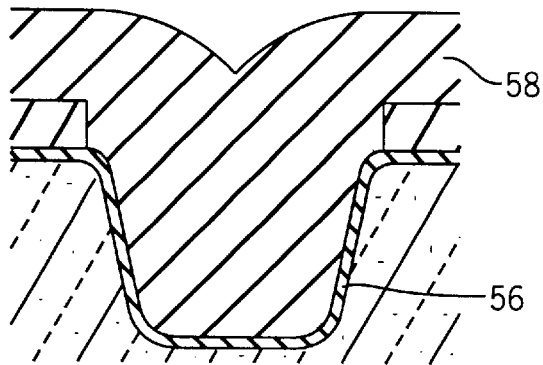
FIG. 4 depicts steps in the process of fabrication of the conventional flash memory cell of FIGS. 1 and 2.
Figure 5:
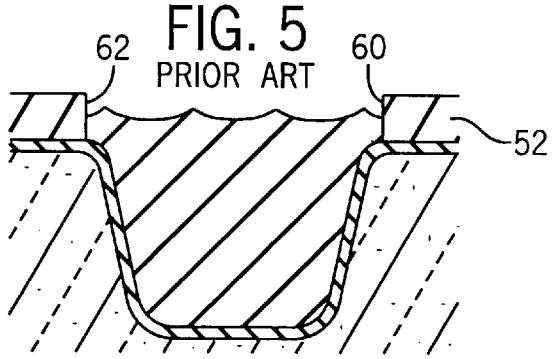
FIG. 5 depicts steps in the process of fabrication of the conventional flash memory cell of FIGS. 1 and 2.

Next, recess 106 is filled with insulative trench fill material 108 by, for example, a PECVD oxide step. Trench fill material 108 is deposited with a thickness less than that of the conventional trench fill material 58 (FIG. 4).

Specifically, trench fill material 108 is deposited with a thickness of less than approximately 7000 Å assuming a trench depth from upper surface 110 to bottom surface 105 of approximately 4000 Å.

Figure 10:
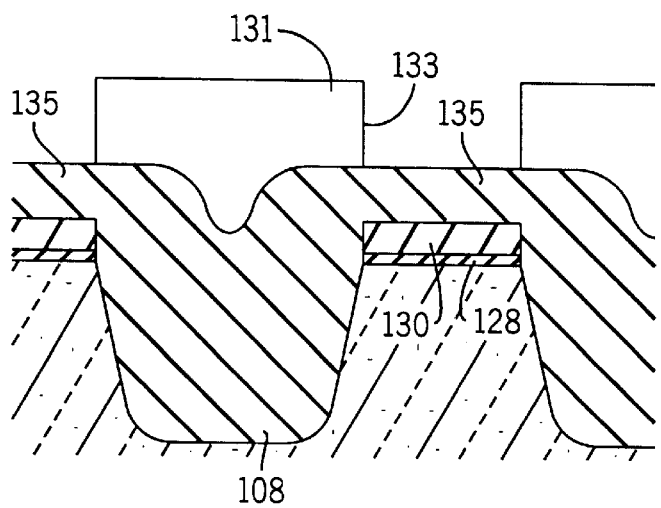
FIG. 10 depicts steps in the process of fabrication of the portion of an integrated circuit of FIG. 8.

Referring now to FIG. 10, a mask layer 131 (e.g., a photoresist layer) is applied over trench fill material 108. Mask layer 131 preferably is applied such that a lateral width of opening 133 is somewhat wider than a lateral width of barrier layer 130 to ensure that barrier layer 130 is completely removed by subsequent etching.

Figure 6:
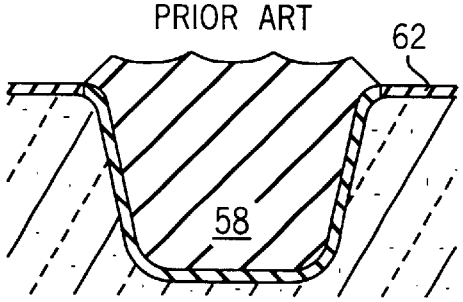
FIG. 6 depicts steps in the process of fabrication of the conventional flash memory cell of FIGS. 1 and 2.
Figure 7:
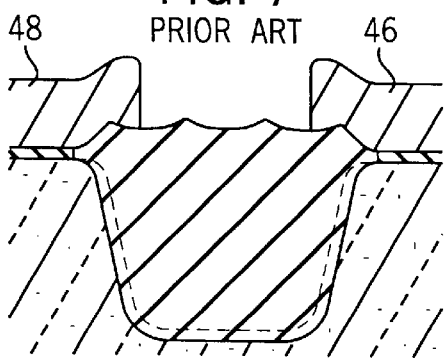
FIG. 7 depicts steps in the process of fabrication of the conventional flash memory cell of FIGS. 1 and 2.
Figure 11:
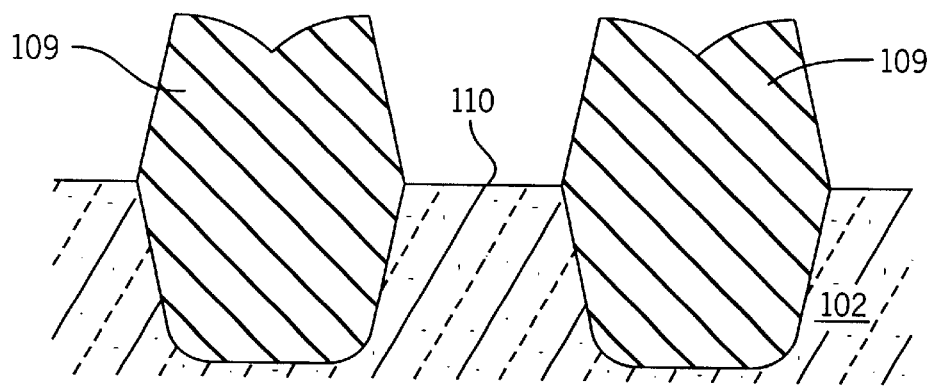
FIG. 11 depicts steps in the process of fabrication of the portion of an integrated circuit of FIG. 8.

Referring now to FIG. 11, an etching step removes insulative layer 128, barrier layer 130, and a portion 135 of trench fill material 108. In this embodiment, trench fill material 108 is etched until upper surface 110 of substrate 102 is exposed. It can be seen that a portion 109 of trench fill material 108 extends above upper surface 110. Note that in the prior art (FIG. 6) only the nitride layer 52 is etched off by selective etching.

Figure 12:
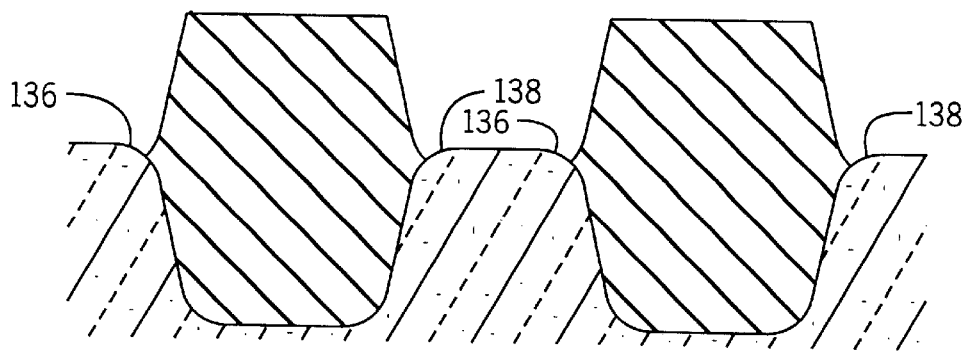
FIG. 12 depicts steps in the process of fabrication of the portion of an integrated circuit of FIG. 8.

In FIG. 12, a sacrificial oxidation and strip off step is performed to round corners 136, 138. In sacrificial oxidation, a thin oxide layer is grown and then stripped off to get the trench corner rounding. This rounding prevents the "double hump effect" in the I-V characteristic curve of the transistor. During this sacrificial oxidation, the level of trench fill material 108 may or may not be lowered further from the etching associated with FIG. 11.

Figure 13:
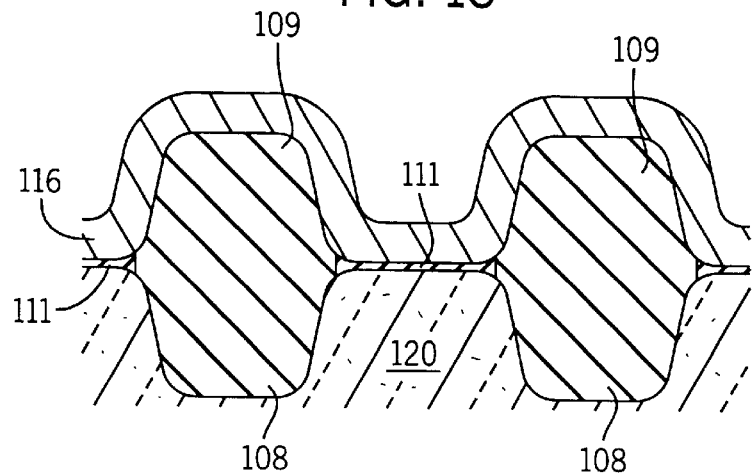
FIG. 13 depicts steps in the process of fabrication of the portion of an integrated circuit of FIG. 8.

In FIG. 13, first insulative layer 111 is thermally grown over substrate 120 or otherwise provided over substrate 120 using a known deposition process (e.g., chemical vapor deposition, physical vapor deposition). In this embodiment, first insulative layer 111 is a tunnel oxide layer ($SiO_2$). Next, first conductive layer 116 ("poly 1") is deposited over first insulative layer 111 and trench fill material 108. Note that poly 1 layer 116 extends over portion 109 of trench fill material 108.

Referring again to FIG. 8, poly 1 layer 116 is masked and etched (i.e., patterned) to form via 140 between first and second conductive portions or wings 118, 120. Second insulative layer 122 is then provided or grown (e.g., ONO) adjacent first conductive layer 116. Second insulative layer 122 electrically isolates first and second conductive portions 118, 120. Next, second conductive layer 124 (e.g., polysilicon) is deposited, followed by deposition of silicide layer 126.

Figure 14:
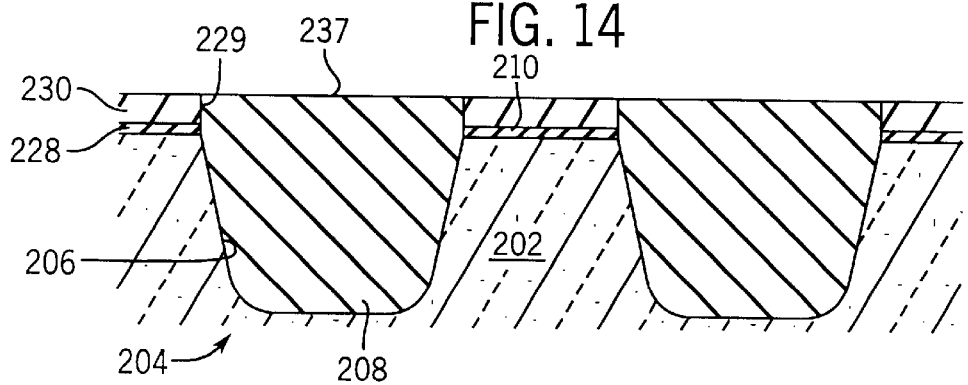
FIG. 14 depicts steps in the process of fabrication of a portion of an integrated circuit according to a second exemplary embodiment of the present invention.

Referring now to FIGS. 14–17, an alternative embodiment of the present invention is disclosed. In this second embodiment, the provision of mask layer 131 as described in FIG. 10 of the first embodiment is eliminated. With reference to FIG. 14, isolation structure 204 is formed by providing an insulative layer 228 including an oxide material (e.g., a pad oxide material, such as, $SiO_2$) over substrate 202. Layer 228 is provided similarly to layer 128 as described in FIG. 9 above. Subsequently, a barrier layer 230, preferably a silicon nitride layer, e.g., $Si_3N_4$, is applied over insulative layer 228 with a thickness somewhat greater than that of layer 128. For example, barrier layer 230 is between approximately 1000 Angstroms and 5000 Angstroms. Using a standard photolithographic process, an aperture 229 is formed in layers 228, 230 at the desired location. A conventional trench etching process, such as a dry or plasma etch, is then utilized to etch recess 206 in substrate 202. A liner oxidation step forms an insulative liner (not shown) along the walls of recess 206.

Next, recess 206 is filled with insulative trench fill material 208 by, for example, a PECVD oxide step. Trench fill material 208 is deposited over recess 206 and barrier layer 230 with a thickness less than that of the conventional trench fill material 58 (FIG. 4). Specifically, trench fill material 208 is deposited with a thickness of less than approximately 7000 Å, assuming a trench depth from upper surface 210 to bottom surface 205 of approximately 4000 Å. Next, trench fill material 208 is planarized (e.g., chemical mechanical planarization or CMP) until an upper surface 237 of material 208 is approximately coplanar with an upper surface of barrier layer 230. Thus, as will be seen, the thickness of barrier layer 229 assists in defining the extent to which trench fill material 208 extends above an upper surface 210 of substrate 202.

Figure 15:
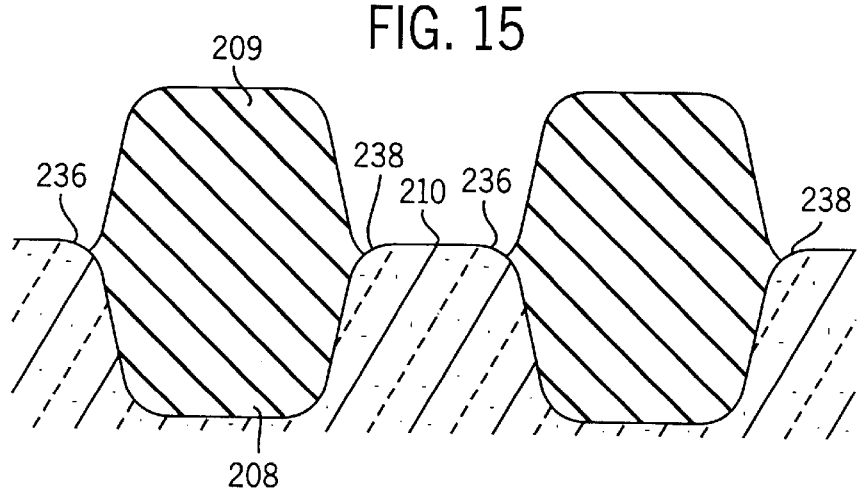
FIG. 15 depicts steps in the process of fabrication of the portion of an integrated circuit of FIG. 14.

Referring now to FIG. 15, a strip step removes insulative layer 228 and barrier layer 230, leaving trench fill material 208. It can be seen that a portion 209 of trench fill material 208 extends above upper surface 210. Also in FIG. 15, a sacrificial oxidation and strip off step is performed to round corners 236, 238. During this sacrificial oxidation, the height and width of trench fill material 208 may or may not be selectively reduced.

Figure 16:
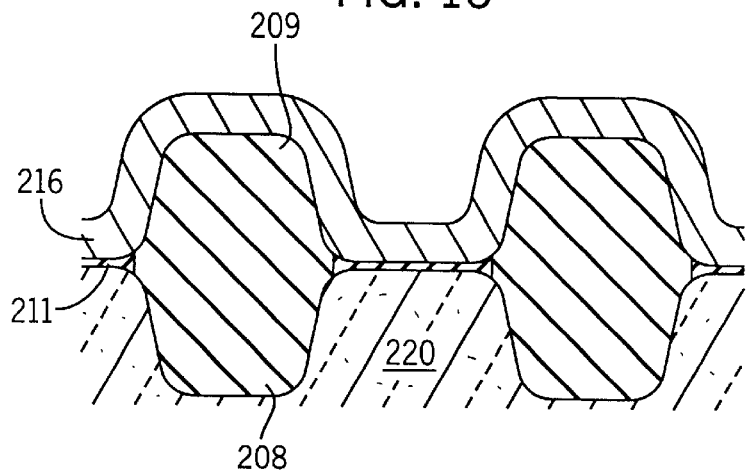
FIG. 16 depicts steps in the process of fabrication of the portion of an integrated circuit of FIG. 14.

In FIG. 16, first insulative layer 211 is thermally grown over substrate 220 or otherwise provided over substrate 220 using a known deposition process (e.g., chemical vapor deposition, physical vapor deposition). In this embodiment, first insulative layer 211 is a tunnel oxide layer ($SiO_2$). Next, first conductive layer 216 ("poly 1") is deposited over first insulative layer 211 and trench fill material 208. Note that poly 1 layer 216 extends over portion 209 of trench fill material 208.

Figure 17:
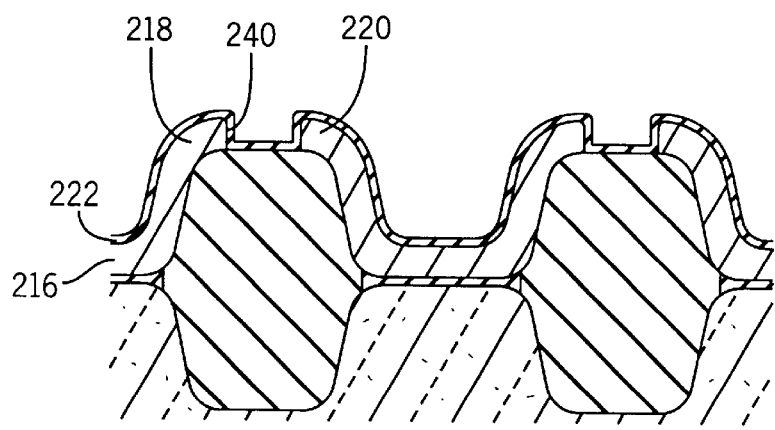
FIG. 17 depicts steps in the process of fabrication of the portion of an integrated circuit of FIG. 14.

Referring now to FIG. 17, poly 1 layer 216 is masked and etched (i.e., patterned) to form via 240 between first and second conductive portions or wings 218, 220. Second insulative layer 222 is then provided or grown (e.g., ONO) adjacent first conductive layer 216. Second insulative layer 222 electrically isolates first and second conductive portions 218, 220. Next, a second conductive layer (not shown) is deposited, followed by deposition of a silicide layer (not shown) in a similar manner as in the first embodiment.

Figure 18:
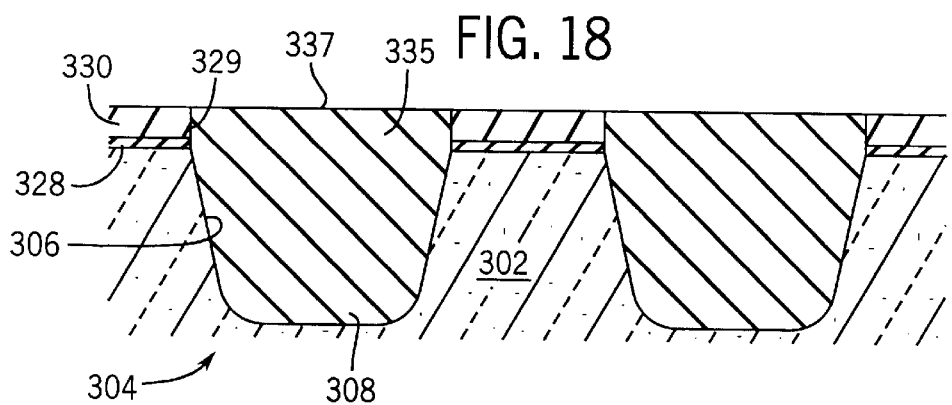
FIG. 18 depicts steps in the process of fabrication of the portion of an integrated circuit according to a third exemplary embodiment of the present invention.

Referring now to FIGS. 18–23, a third exemplary embodiment of the present invention is shown. In this third embodiment, the trench fill material includes a first trench fill material provided in a first fabrication step and a second trench fill material in a second fabrication step. In FIG. 18, isolation structure 304 is formed by providing an insulative layer 328 including an oxide material (e.g., a pad oxide material, such as, $SiO_2$) over substrate 302. Layer 328 is grown in a conventional thermal process, or applied by a chemical vapor deposition (CVD) or a physical vapor deposition (PVD) process. Subsequently, a barrier layer 330, preferably a nitride layer, e.g., $Si_3N_4$, is applied over insulative layer 328 with a thickness of approximately 1000 to 7000 Å, typically 2000 to 4000 Å. Note that this thickness is somewhat thicker than that of the embodiment described in FIG. 9. Using a standard photolithographic process, an aperture 329 is formed in layers 328, 330 at the desired location. A conventional trench etching process, such as a dry or plasma etch, is then utilized to etch recess 306 in substrate 302. A liner oxidation step forms an insulative liner (not shown) along the walls of recess 306.

Next, recess 306 is filled with insulative trench fill material 308 by, for example, a PECVD oxide step. Trench fill material 308 is deposited with a thickness less than that of the conventional trench fill material 58 (FIG. 4). Specifically, trench fill material 308 is deposited with a thickness of less than approximately 7000 Å. Next, trench fill material 308 is planarized (e.g., chemical mechanical planarization or CMP) until an upper surface 337 of material 308 is approximately coplanar with an upper surface of barrier layer 330.

Figure 19:
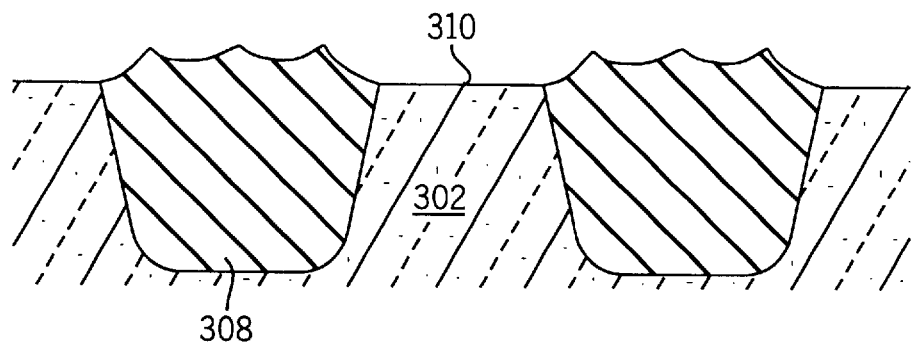
FIG. 19 depicts steps in the process of fabrication of the portion of an integrated circuit of FIG. 18.

Referring now to FIG. 19, an etching step removes insulative layer 328, barrier layer 330, and a portion 335 of trench fill material 308. In this embodiment, trench fill material 308 is etched until upper surface 310 of substrate 302 is exposed.

Figure 20:
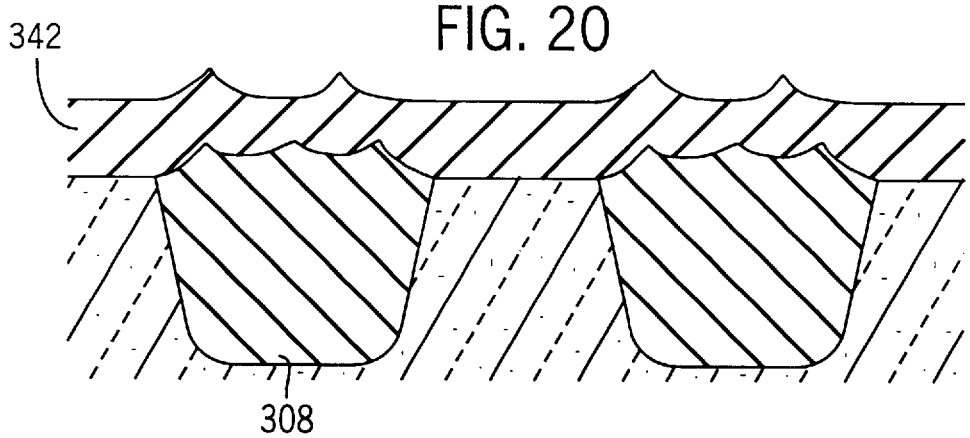
FIG. 20 depicts steps in the process of fabrication of the portion of an integrated circuit of FIG. 18.
Figure 21:
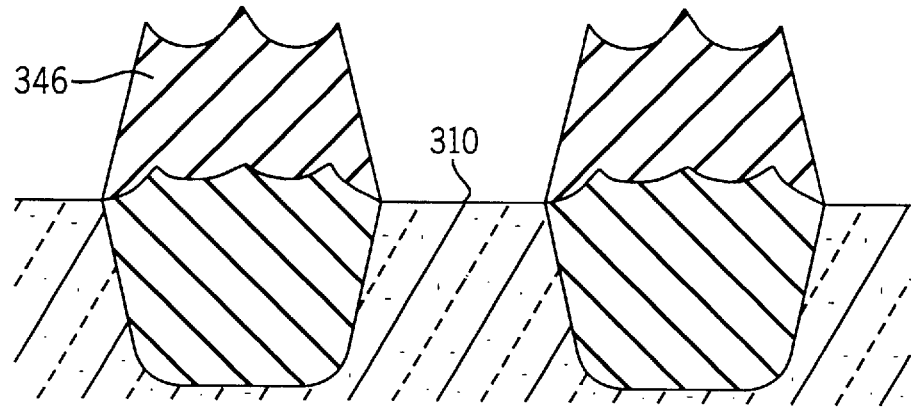
FIG. 21 depicts steps in the process of fabrication of the portion of an integrated circuit of FIG. 18.

Referring now to FIG. 20, an insulative layer 342 (e.g., a CVD oxide) is applied over trench fill material 308 with a thickness of approximately 1000 to 5000 Å, typically 2000 to 4000 Å. Insulative layer 342 is then patterned i.e., masked and etched, as described with reference to FIG. 10 above) to form a second trench fill material 346 (FIG. 21) above trench fill material 308. It can be seen that trench fill material 346 extends above upper surface 310.

In FIG. 22, a sacrificial oxidation and strip off step is performed to round corners 336, 338. During this sacrificial oxidation, the level of second trench fill material 346 may or may not be lowered further from the stripping associated with FIG. 19. A first insulative layer 311 is thermally grown over substrate 320 or otherwise provided over substrate 320 using a known deposition process (e.g., chemical vapor deposition, physical vapor deposition). In this embodiment, first insulative layer 311 is a tunnel oxide layer (SiO$_2$). Next, first conductive layer 316 ("poly 1") is deposited over first insulative layer 311 and trench fill material 308. In this embodiment, first poly 1 layer 316 also extends over second trench fill material 346.

Referring now to FIG. 23, poly 1 layer 316 is masked and etched (i.e., patterned) to form via 340 between first and second conductive portions or wings 318, 320. Second insulative layer 322 is then provided or grown (e.g., ONO) adjacent first conductive layer 316. Second insulative layer 322 electrically isolates first and second conductive portions 318, 320. Next, a second conductive layer (not shown) is deposited, followed by deposition of a silicide layer (not shown) in a similar manner as in the first embodiment.

While the embodiments illustrated in the FIGS. and described above are presently preferred, it should be understood that these embodiments are offered by way of example only. For example, the specific materials and dimensions utilized in the preferred embodiments disclosed herein are provided as examples and are not meant to preclude the substitution of like materials or dimensions. Also, while the embodiments disclosed are particularly suitable for a flash EPROM or other non-volatile memory, they may find application in non-memory devices. The invention is not limited to a particular embodiment, but extends to various modifications that nevertheless fall within the scope of the appended claims.

What is claimed is:

1. A method of fabricating an integrated circuit on a substrate, comprising:
   forming a trench in the substrate, the trench extending below a surface of the substrate;
   providing a trench fill material in the trench such that the trench fill material extends above the surface of the substrate, wherein the step of providing a trench fill material includes:
   providing a trench fin oxide over the trench;
   applying a photoresist mask above the trench; and
   etching the trench fill oxide; providing a first conductive layer over at least a portion of the trench fill material;
   providing an insulative material over the first conductive layer; and providing a second conductive layer over the insulative material.

2. The method of claim 1, further comprising providing a nitride layer over the substrate, the nitride layer having a thickness of between 1000 and 5000 Angstroms, wherein the trench fill material and nitride layer are planarized.

3. The method of claim 1, further comprising patterning the first conductive layer to form first and second conductive wings and providing an insulative material to electrically isolate the first and second conductive wings.

4. The method of claim 1, further comprising providing an insulative material over the trench fill material and patterning the insulative material to fabricate a second trench fill material above the trench, the first conductive layer extending over at least a portion of the second trench fill material.

5. The method of claim 1, wherein the photoresist mask has a mask portion over the trench and an opening over the surface of the substrate.

6. The method of claim 5, further comprising:
   providing a barrier layer over the substrate; and
   forming apertures in the barrier layer, wherein the barrier layer has a lateral width between the apertures, wherein the opening of the mask portion is somewhat wider than the lateral width between the apertures.

7. An integrated circuit having an increased gate coupling capacitance, the integrated circuit fabricated by a process comprising:
   forming a trench in the substrate, the trench extending below a surface of the substrate;
   a providing a trench fill material in the trench such that the trench fill material extends above the surface of the substrate, wherein the step of providing a trench fill material includes:
   providing a trench fill oxide over the trench;
   applying a photoresist mask above the trench; and
   etching the trench fill oxide; providing a first conductive layer over at least a portion of the trench fill material;
   providing an insulative material over the first conductive layer; and
   providing a second conductive layer over the insulative material.

8. The integrated circuit of claim 7, further comprising providing a nitride layer over the substrate, the nitride layer having a thickness of between 1000 and 5000 Angstroms, wherein the trench fill material and nitride layer are panarized.

9. The integrated circuit of claim 7, further comprising patterning the first conductive layer to form first and second conductive wings and providing an insulative material to electrically isolate the first and second conductive wings.

10. The integrated circuit of claim 7, further comprising providing an insulative material over the trench fill material and patterning the insulative material to fabricate a second trench fill material above the trench, the first conductive layer extending over at least a portion of the second trench fill material.

11. A method of fabricating an integrated circuit on a substrate, comprising:

forming a trench in the substrate, the trench extending below a surface of the substrate;

providing a trench fill material in the trench such that the trench fill material extends above the surface of the substrate, wherein the step of providing a trench fill material includes:

providing a trench fill oxide over the trench;

applying a photoresist mask above the trench and exclusive of the surface of the substrate outside of the trench; and etching the trench fill oxide whereby the photoresist mask protects the trench fill oxide so that the trench fill oxide extends above the surface after the etching step;

providing a first conductive layer over at least a portion of the trench fill material;

providing an insulative material over the first conductive layer; and providing a second conductive layer over the insulative material.

12. The method of claim 11, further comprising providing a nitride layer over the substrate, the nitride layer having a thickness of between 1000 and 5000 Angstroms, wherein the trench fill material and nitride layer are planarized before the etching step.

13. The method of claim 12, further comprising patterning the first conductive layer to form first and second conductive wings and providing an insulative material to electrically isolate the first and second conductive wings.

14. The integrated circuit of claim 13, further comprising providing an insulative material over the trench fill material and patterning the insulative material to fabricate a second trench fill material above the trench, the first conductive layer extending over at least a portion of the second trench fill material.

15. The method of claim 11, further comprising patterning the first conductive layer to form first and second conductive wings and providing an insulative material to electrically isolate the first and second conductive wings, a pattern of the first conductive layer having an aperture centered above the trench.

16. The method of claim 15, wherein the first and second wings are floating gates.

17. The method of claim 16, wherein the floating gates have increased coupling capacitance due to the protection of the trench fill oxide.

18. The method of claim 11, further comprising providing an insulative material over the trench fill material and patterning the insulative material to fabricate a second trench fill material above the trench, the first conductive layer extending over at least a portion of the second trench fill material.

19. The method of claim 11, wherein the photoresist mask has a mask portion over the trench and an opening over the surface of the substrate.

20. The method of claim 19, further comprising:

providing a barrier layer over the substrate; and forming apertures in the barrier layer, wherein the barrier layer has a lateral width between the apertures, wherein the opening of the mask portion is somewhat wider than the lateral width between the apertures.

* * * * *

UNITED STATES PATENT AND TRADEMARK OFFICE
CERTIFICATE OF CORRECTION

PATENT NO. : 6,682,978 B1
DATED : January 27, 2004
INVENTOR(S) : Stephen Keetai Park and Steven C. Avanzino It is certified that error appears in the above-identified patent and that said Letters Patent is hereby corrected as shown below:

Column 8,
Line 10, replace the word "fin" with the word -- fill --.
Line 46, delete the word "a" before the word "providing".
Line 63, replace the word "panarized" with the word -- planarized --.

Signed and Sealed this

Eleventh Day of May, 2004

JON W. DUDAS
*Acting Director of the United States Patent and Trademark Office*